United States Patent
Tuo

(10) Patent No.: US 7,817,973 B1
(45) Date of Patent: Oct. 19, 2010

(54) METHOD AND APPARATUS OF DOHERTY-TYPE POWER AMPLIFIER SUBSYSTEM FOR WIRELESS COMMUNICATIONS SYSTEMS

(75) Inventor: Xihe Tuo, Los Gatos, CA (US)

(73) Assignee: DAC Semiconductor Corporation, San Jose, CA (US)

( * ) Notice: Subject to any disclaimer, the term of this patent is extended or adjusted under 35 U.S.C. 154(b) by 545 days.

(21) Appl. No.: 11/867,700

(22) Filed: Oct. 5, 2007

Related U.S. Application Data

(60) Provisional application No. 60/849,704, filed on Oct. 5, 2006.

(51) Int. Cl.
H04B 1/04 (2006.01)
H04K 3/00 (2006.01)

(52) U.S. Cl. .................. 455/126; 455/107; 455/127.4

(58) Field of Classification Search ............ 455/75–76, 455/78, 126, 127.1–127.5, 107; 330/124 R, 330/126, 278, 285
See application file for complete search history.

(56) References Cited

U.S. PATENT DOCUMENTS

| 5,196,806 | A | * | 3/1993 | Ichihara | 330/137 |
| 5,459,728 | A | * | 10/1995 | Yoshioka et al. | 370/332 |
| 7,526,259 | B2 | * | 4/2009 | Yamaguchi | 455/127.1 |
| 2003/0184382 | A1 | * | 10/2003 | Tsutsui et al. | 330/285 |
| 2004/0174213 | A1 | * | 9/2004 | Thompson | 330/124 R |
| 2007/0008037 | A1 | * | 1/2007 | Tsutsui et al. | 330/285 |

* cited by examiner

*Primary Examiner*—Lee Nguyen
(74) *Attorney, Agent, or Firm*—Fernandez & Associates, LLP

(57) ABSTRACT

Method and apparatus for high-efficiency radio frequency (RF) power amplification. A method high-efficiency RF power amplification comprises receiving control and power signals, sampling power output of a main stage amplifier, comparing sampled amplifier output power with output power requirement information, reconfiguring bias of the cascaded amplifiers based on power adjustment information, coupling the output of a main stage power amplifier to a load mismatch protection circuit. An electronic apparatus for a Doherty-type high-efficiency RF power amplifying subsystem comprising a power interface circuit coupled to a bias network control circuit, an output power sampling circuit, the comparator comparing signal representing amplifier output power with the power control signal, the bias network control circuit adapts bias condition of the amplifier block, a load mismatch protection circuit provides well-controlled load, thereby the amplifier block amplifies RF input signal transmitted to the subsystem output.

25 Claims, 4 Drawing Sheets

METHOD AND APPARATUS OF DOHERTY-TYPE POWER AMPLIFIER SUBSYSTEM FOR WIRELESS COMMUNICATIONS SYSTEMS

CROSS REFERENCE TO RELATED APPLICATIONS

This application claims priority to U.S. Provisional Patent Application No. 60/849,704, entitled "Applications of Doherty-Type Power Amplifier Subsystem in TDMA-Based Wireless Communications Systems" and filed on Oct. 5, 2006.

BACKGROUND

1. Field

This invention relates to improvement in battery life (also called talk time or usage time) of mobile handsets for wireless communications systems.

2. Related Art

Time Division Multiplex Access (TDMA) based wireless communications systems such as Global System for Mobile communications (GSM), General Packet Radio Service (GPRS), Enhanced Data rates for GSM Evolution (EDGE) as well as future Time Division-Synchronous Code Division Multiple Access (TD-SCDMA) are used globally by 80% of mobile handset subscribers. Mobile handsets have become the platform to integrate possible applications like FM radio, MP3, camera, video, TV, Internet browsing, etc. While mobile handsets are continually adding new and innovative features and applications, handsets are battery-powered devices. The handset battery life will become increasing shorter and due to increasing power consumption budget.

Finding methods to increase the battery life is becoming a challenging issue for mobile handset designers. Analyzing power consumption budget in common handsets, it is found that up to 70% of total power is consumed by power amplifiers (PAs). Further analysis of handsets usage scenarios show handsets are operated mostly in its medium and low transmitted power levels. This knowledge leads to a methodology to increase handset talk time, improving power amplifier power efficiency for medium and low handset transmitting output power.

Conventional power amplifiers used in mobile handsets have low power efficiency at low transmitting power operation. A method of improving amplifier subsystem power efficiency at low transmitting power operation is the use of Doherty-type power amplifiers. Doherty-type amplifiers are designed to have high power efficiency over a wide output power range. The Doherty-type power amplifier subsystem will deliver significant improvement of power-added efficiency in medium and low transmitted power levels, which leads to longer battery life of handsets because of the handset usage scenarios. It also allows accurate power control, calibration and easy interface with base bands or RF transceivers.

The prior art focuses exclusively on the Doherty amplifier and the issues matching the Doherty amplifier output impedance to a fixed external impedance, as well as adjusting the Doherty amplifier bias to correct output power variation due to shifts in temperature or supply voltage. To implement the Doherty-type power amplifier subsystem for handset application several drawbacks need to be addressed. The first is the need to match the impedance seen by the Doherty-type amplifier from subsystem output (e.g. antenna, switch, diplexer). The second drawback to be overcome is to optimize the amplifier subsystem bias for maximum power efficiency as the transmitted output power is varying.

SUMMARY

Disclosed are method and electronic apparatus high-efficiency RF power amplification using Doherty-type power amplifier, allowing for high-efficiency multi-mode/multi-band modules and enabling long battery life cell phone handsets.

In one aspect, a method high-efficiency RF power amplification comprises receiving control and power signals, sampling power output of a main stage amplifier, comparing sampled amplifier output power with output power requirement information, reconfiguring bias of the cascaded amplifiers based on power adjustment information, coupling the output of a main stage power amplifier to a load mismatch protection circuit.

In another aspect, an electronic apparatus for a Doherty-type high-efficiency RF power amplifying subsystem comprising a power interface circuit coupled to a bias network control circuit, an output power sampling circuit, the comparator comparing signal representing amplifier output power with the power control signal, the bias network control circuit adapts bias condition of the amplifier block, a load mismatch protection circuit provides well-controlled load, thereby the amplifier block amplifies RF input signal transmitted to the subsystem output. Further aspects of the present invention are described herein.

BRIEF DESCRIPTION OF DRAWINGS

The drawings illustrate the design and utility of embodiments of the present invention, in which similar elements are referred to by common reference numerals. In order to better appreciate the advantages and objects of the embodiments of the present invention, reference should be made to the accompanying drawings that illustrate these embodiments. However, the drawings depict only some embodiments of the invention, and should not be taken as limiting its scope. With this caveat, embodiments of the invention will be described and explained with additional specificity and detail through the use of the accompanying drawings in which.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Disclosed is a method and electronic apparatus for high efficiency radio frequency (RF) power amplification using a Doherty-type power amplifier.

Figure 1:
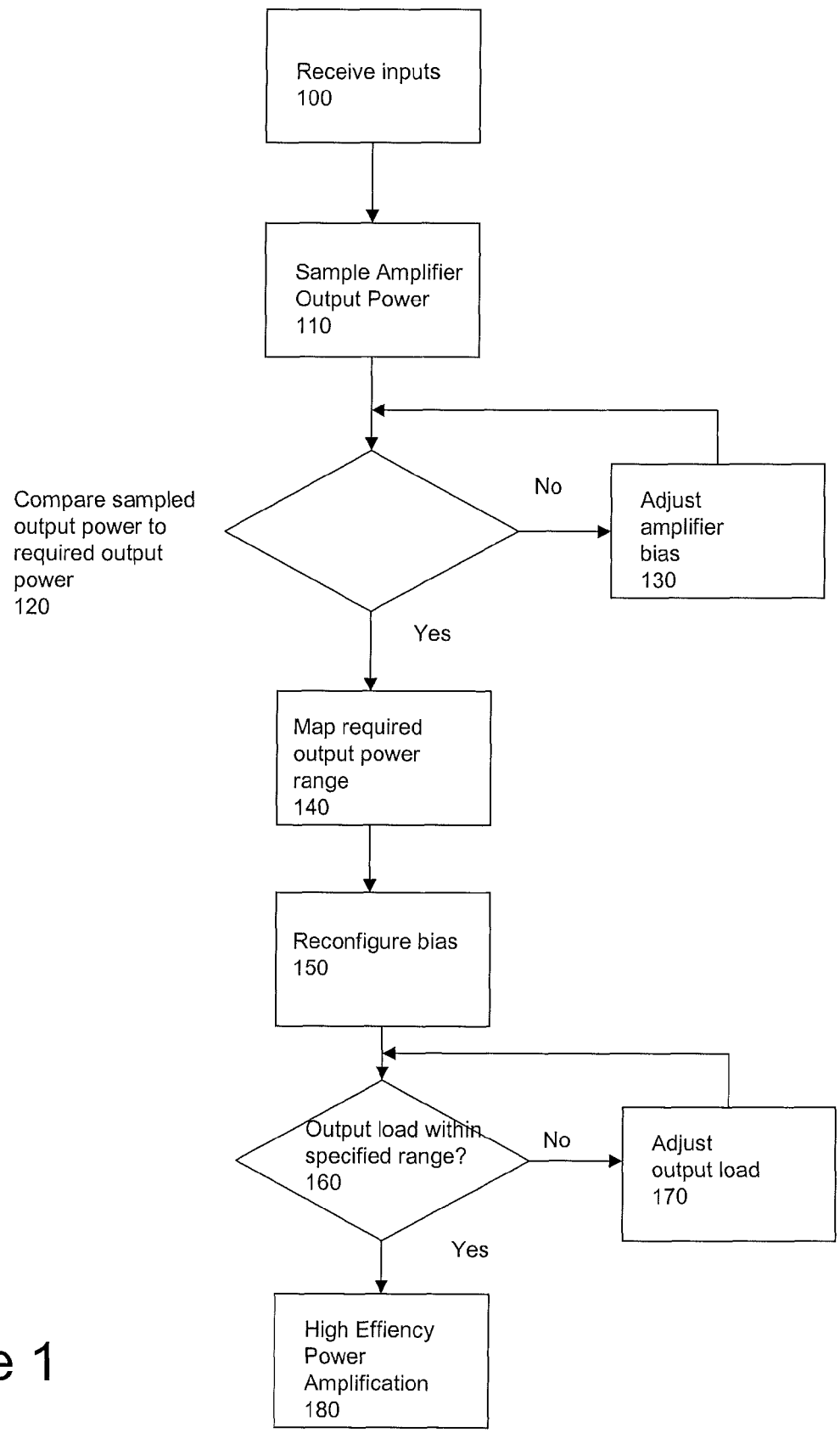
FIG. 1 is a flow chart illustrating a method for high-efficiency radio frequency (RF) power amplification.

FIG. 1 is a flow chart illustrating a method for high-efficiency radio frequency (RF) power amplification. The amplifier subsystem receives control and power signals from one or more inputs, step 100. These inputs include: receiving power control, RF power input signal, direct current (DC) power signal, band selection signal. The band selection signal determines the subsystem frequency band. Other input signals are: the mode control signal, which adjusts the bias of the amplifier block according to the application requirements for a specific wireless protocol, and the output power range signal The power output of a main stage amplifier is sampled, step 110. The main stage output power is sampled during transmission time periods. The amplifier power output information transmitted to the comparator to reconfigure the amplifier block during time between transmission time periods.

A comparator to compares signal representing amplifier output power with power control signal, step 120. If the amplifier power output is lower than the required output subsystem power will signal for biasing to increase the amplifier output. Conversely, the amplifier power output being higher than required output power will trigger a signal for biasing to reduce the amplifier power. The amplifier block bias is adjusted, step 130. The comparison will continue until the amplifier output power matches the required subsystem output power.

The power range signal, representing one or more power ranges, is mapped to amplifier block biasing information, step 140. In one embodiment, the power range signal represents $2^N$ power ranges, where N is number of inputs. A signal is sent to the network bias block representing the required output power range.

Optionally, the required power range may be mapped to specific values of the output range signal.

The amplifier block bias is reconfigured using the amplifier block biasing information from the power interface circuit, the mode control signal or the comparator, step 150. In one embodiment, the amplifier block bias is reconfiguring to discrete bias settings corresponding to specific power ranges.

Optionally, the network bias control circuit is reconfigured by adaptively adjusting bias settings for each power range.

The amplifier output is coupled to a load mismatch protection circuit, step 160, where the load mismatch protection circuit provides a well-controlled impedance to an amplifier output adjusting to impedance variation on a subsystem output, step 170. Load adjustment occurs until the impedance is within a specified range.

The subsystem achieves high efficiency RF power amplification, step 180.

Figure 2:
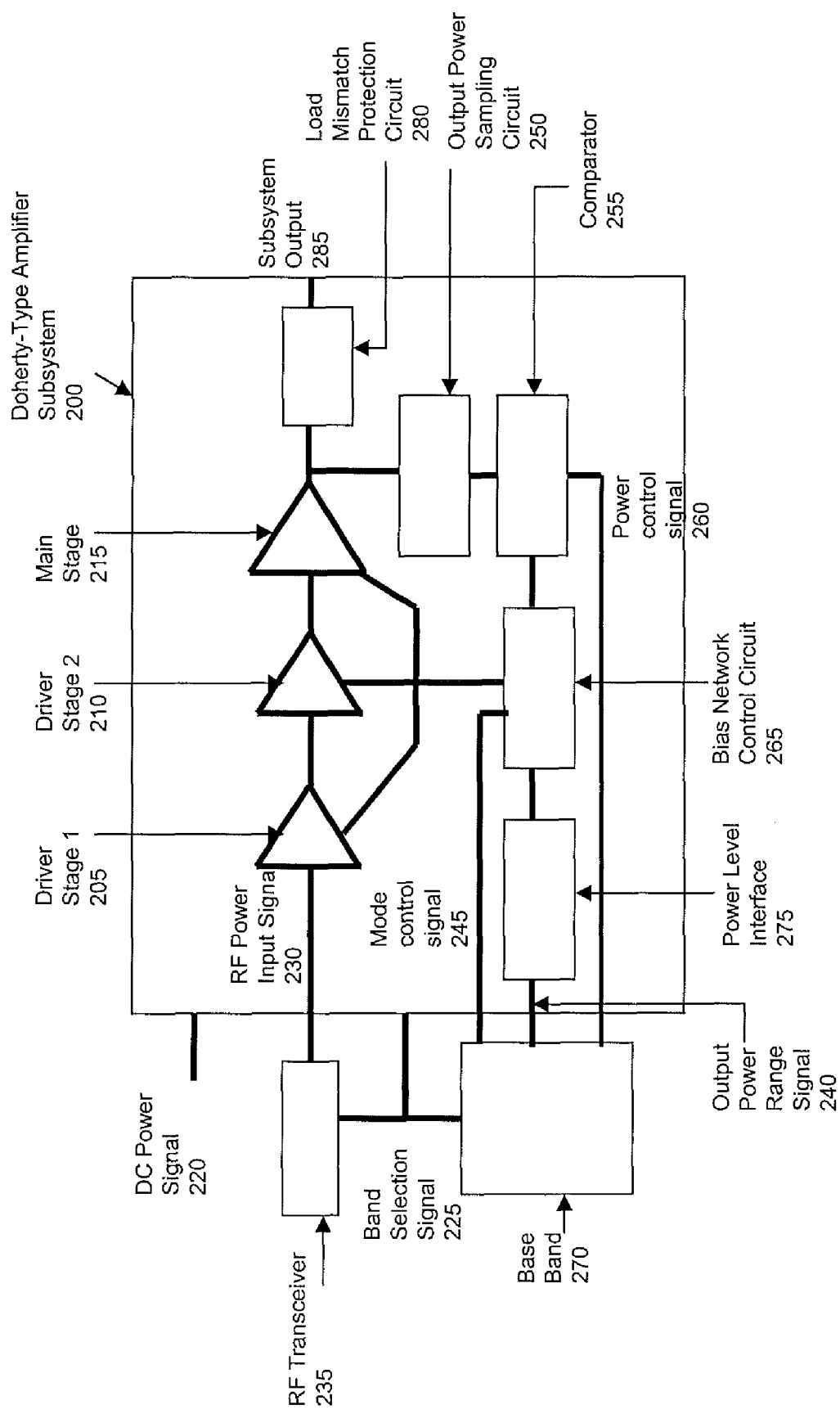
FIG. 2 is a Doherty-type power amplifier subsystem implementation.

FIG. 2 illustrates the preferred embodiment of the Doherty-type amplifier subsystem 200 for wireless communication systems. The power amplifier block consists of several cascaded amplifier stages, driver stage #1 205, driver stage #2 210 and the main stage 215, with each stage biased for A, AB, C, E or F class operation. As understood herein, the term "amplifier block" is interpreted and construed broadly to mean a one or more cascaded amplifiers with a Doherty-type amplifier main stage. The driver stages are gain stages, which are required to have sufficient gain and linearity to drive the main stage power amplifier.

A number of inputs are provided to the Doherty-type PA subsystem for proper operation. The DC power signal 220 is received from an external power source. The band selection signal 225 is received by the Doherty-type PA subsystem and determines the subsystem frequency band of operation (e.g. 900 MHz or 1.8 GHz). The RF power input signal 230 is received from the external RF transceiver 235 and transmitted to the amplifier block. The output power range signal 240 is received from the base band. This signal is used to provide output power information to the amplifier subsystem and represents the range of the required output power. The mode control signal 245 is used to adjust bias of the amplifier block according to the application requirements for the specific wireless protocol (e.g. GSM, EDGE, etc.) used by the handset.

The Doherty-type power amplifier subsystem adjusts the amplifier block bias to minimize subsystem output power variation due to temperature, supply voltage, input power, etc. The power variation adjustment is performed by a control loop, which includes the output power sampling circuit 250, the comparator 255 and the bias control circuit 265. The output power sampling circuit 250 samples the power output of the main stage Doherty-type amplifier and transforms the sampled amplifier power to a signal that represents the sampled output power. The signal representing the sampled amplifier power is transmitted to the comparator 255.

Optionally output power sampling can take the form of power coupling, current sensing or voltage sensing.

The power control signal 260 is used by the comparator as a reference signal for calibrate the output power of the amplifier subsystem and minimize the difference from the required output power. The power control signal 260 represents the required output power for the amplifier subsystem. The comparator 255 takes as inputs the sampled power signal from the output sampling circuit 250 and the power control signal 260. The comparator compares the input signals and determines difference between the sampled amplifier power output and the required subsystem power. A signal representing this power difference is transmitted to the bias network circuit 265.

As understood herein, the term "amplifier output" is interpreted and construed broadly to mean the output of the main stage amplifier in an amplifier block. For optimum subsystem performance, the amplifier output power levels need to be calibrated beforehand since the transmitted output power is required to meet a specified output power time template. The amplifier block biasing for optimum operation is based on real time power requirement information from the base band 270. In Time Division Multiplex Access (TDMA)-based wireless communication systems, voice or data transmission is based on a time slot structure. Between consecutive transmission time slots, there is a guard time during which no data is transmitted. During the guard time, the output power needed for the upcoming data transmission is known and the power level interface circuit 275 uses the power level information to re-configure the amplifier block bias.

In the preferred embodiment, the power level interface circuit 275 to the base band 270 has one or more inputs. Each input can describe two states, a high power level and low power level. With additional inputs, the entire amplifier output power range can be defined in more detail. For example, with two inputs, the output power range can be partitioned into four power ranges. In this mapping scheme, the total number of $2^N$ power ranges may be described, where N is number of inputs. The power level interface transmits a signal representing the power range to the bias network circuit 265.

Optionally, the power range signal to the power interface circuit can may be mapped to a specific power range for a specified input value.

Reconfiguring the bias of the amplifier block by the bias network control circuit 265 is based on the biasing information received from the power level interface 275, the mode control signal 245 or the comparator 255. In the preferred embodiment, the bias network control circuit 265 may have a discrete bias setting for each output power range depending on the output power behavior. The amplifier block can be configured by adjusting the bias current.

Optionally, the network bias control circuit may be adaptively reconfigured, adjust bias settings for each power range and the amplifier bias voltage may be adjusted.

A load mismatch protection circuit 280 is used, making the amplifier subsystem resistant to load mismatch conditions between the subsystem output and the amplifier output. As understood herein, the term "well-controlled impedance" is interpreted and construed broadly to mean an impedance that is within a specified range. For optimum performance, the Doherty PA should be coupled to a well-controlled impedance. The impedance from the subsystem output may vary due to environmental conditions, as well as the changing orientation of the handset during operation. The load mismatch protection circuit 280 couples the amplifier output to subsystem output 285. The preferred embodiment, a circuit monitors load variation and adjusts itself to give a well-controlled load. In the preferred embodiment, the subsystem output is connected to a duplexer and antenna.

Optionally for the load mismatch circuit other components such as couplers, combiners, isolators, or circulators may be used. In optional embodiments, the subsystem output can be connected to a switch or diplexer.

Figure 3:
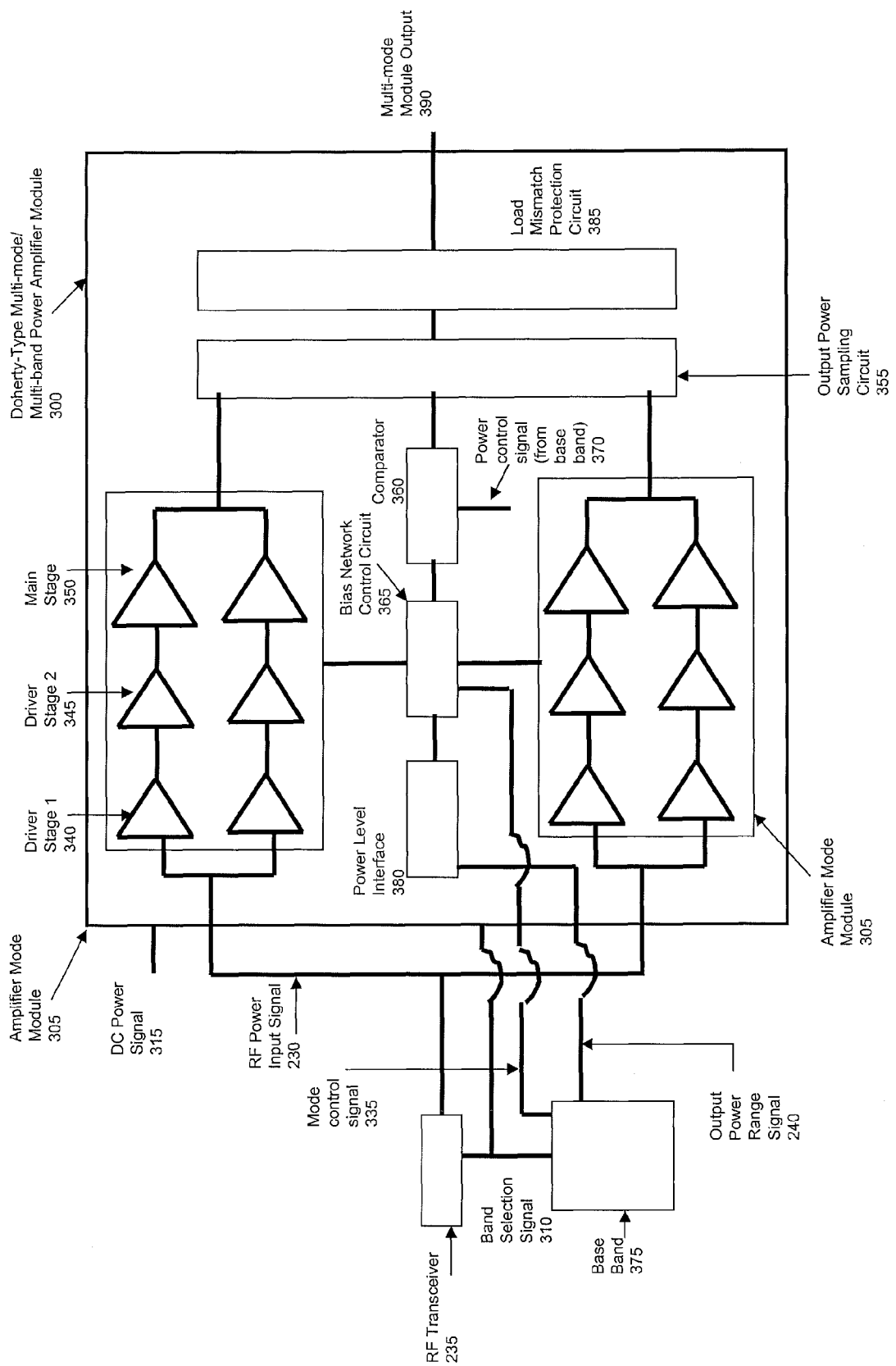
FIG. 3 is a multi-band/multi-band Doherty-type power amplifier module.

An increasingly number of handsets are designed to be used operated in multi-mode combinations like GSM and EDGE, or GSM and W-CDMA. Additionally, these handsets may be designed to work with different frequency bands for each wireless protocol, such as 900 MHz and 1.8 GHz frequency bands. FIG. 3 illustrates a multi-mode/multi-band Doherty-type power amplifier module 300. The multi-band/multi-mode power amplifier module 300 contains one or more amplifier mode modules 305. As understood herein, the term "amplifier mode module" is interpreted and construed broadly to mean a one or more amplifier blocks operating using a specific wireless protocol. Each amplifier block in a amplifier mode module 305 operates at a specific frequency band, controlled by the band selection signal 310.

The multi-mode/multi-band power amplifier module (hereinafter also referred to as "multi-mode module") receives a number of inputs for proper operation. The DC power signal 315 is received from an external power source. The RF power input signal 320 is received from the external RF transceiver 325 and transmitted to the amplifier mode modules 305. The output power range signal 330 is received from the base band and this signal is used to provide output power information to the amplifier subsystem and represents the range of the required output power. The mode control signal 335 is used to adjust bias of the amplifier mode modules according to the application requirements for the specific wireless protocol (e.g. GSM, EDGE, etc.) used by the handset.

The power amplifier block within each amplifier mode module consists of several cascaded amplifier stages, driver stage #1 340, driver stage #2 345 and the main stage 350, with each stage biased for A, AB, C, E or F class operation. The driver stages are gain stages, which are required to have sufficient gain and linearity to drive the main stage power amplifier.

The multi-mode module 300 adjusts the amplifier blocks bias within one or more amplifier mode module, to minimize subsystem output power variation due to temperature, supply voltage, input power, etc. The power variation adjustment is performed by a control loop, which includes the output power sampling circuit 355, the comparator 360 and the bias control circuit 365. The output power sampling circuit 355 samples mode module output and transforms the sampled mode module output power to a signal that represents the sampled output power. As understood herein, the term "mode module output" is interpreted and construed broadly to mean the main stage amplifier output from one or more amplifier blocks in an amplifier mode module. The signal representing the sampled mode module output power is transmitted to the comparator 360.

Optionally mode module output power sampling can take the form of power coupling, current sensing or voltage sensing.

The power control signal 370 is used by the comparator as a reference signal for calibrate the mode module output power and minimize the difference from the required output power. The power control signal 370 represents the required output power for the multi-mode module. The comparator 360 takes as inputs the sampled power signal from the output sampling circuit 355 and the power control signal 370. The comparator compares the input signals and determines difference between the sampled amplifier power output and the required multi-mode module output power. A signal representing this power difference is transmitted to the bias network circuit 365.

The amplifier block biasing for optimum operation is based on real time power requirement information from the base band 375. Between consecutive transmission time slots, there is a guard time during which no data is transmitted. During the guard time, the output power needed for the upcoming data transmission is known and the power level interface circuit 380 uses the power level information to re-configure the amplifier block bias within one or more amplifier mode module.

In the preferred embodiment, the power level interface circuit 380 to the base band 375 has one or more inputs. Each input can describe two states, a high power level and low power level. With additional inputs, the entire amplifier output power range can be defined in more detail. For example, with two inputs, the output power range can be partitioned into four power ranges. In this mapping scheme, the total number of $2^N$ power ranges may be described, where N is number of inputs. The power level interface transmits a signal representing the power range to the bias network circuit 365.

Optionally, the power range signal to the power interface circuit can may be mapped to a specific power range for a specified input value.

Reconfiguring the bias of the amplifier blocks for one or more amplifier mode modules by the bias network control circuit 365 is based on the biasing information received from the power level interface 380, the mode control signal 335 or the comparator 360. In the preferred embodiment, the bias network control circuit 365 may have a discrete bias setting for each output power range depending on the output power behavior. The amplifier block can be configured by adjusting the bias current.

Optionally, the network bias control circuit may be adaptively reconfigured, adjust bias settings for each power range and the amplifier bias voltage may be adjusted.

A load mismatch protection circuit 385 is used, making the amplifier subsystem resistant to load mismatch conditions between the subsystem output and the amplifier output. For optimum performance, the operating Doherty PA should be coupled to a well-controlled impedance. The impedance from the multi-mode module output 390 may vary due to environmental conditions, as well as the changing orientation of the handset during operation. The load mismatch protection circuit 385 couples the amplifier output to subsystem output 390. The preferred embodiment, a circuit monitors load variation and adjusts itself to give a well-controlled load. In the preferred embodiment, the multi-mode module output 390 is connected to a duplexer and antenna.

Optionally for the load mismatch circuit other components such as couplers, combiners, isolators, or circulators may be used. In optional embodiments, the subsystem output can be connected to a switch or diplexer.

Figure 4:
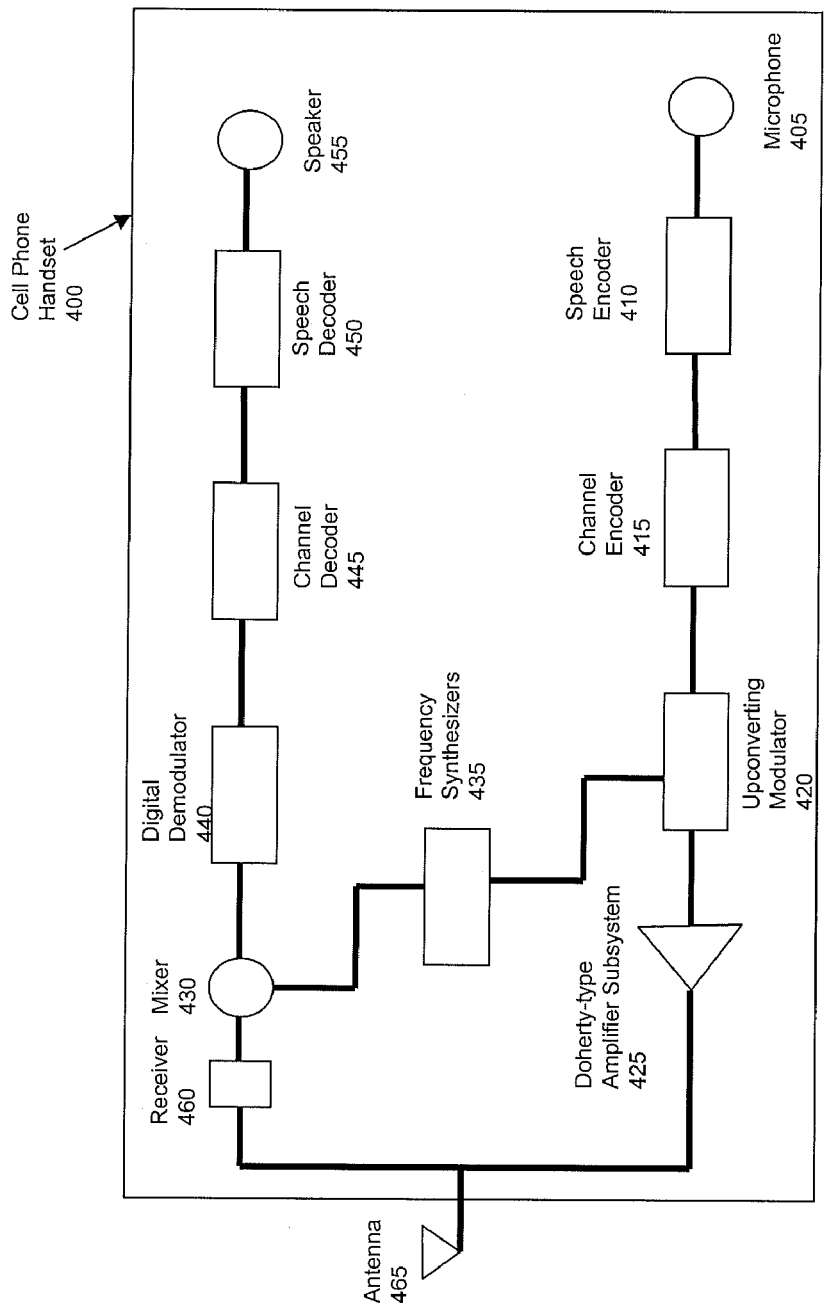
FIG. 4 is a schematic of cell phone handset using Doherty-type power amplifier subsystem.

FIG. 4 is a schematic of cell phone handset 400 using Doherty-type power amplifier subsystem. The operation of the cell phone can be divided into transmitting and receiving functions. The transmitting process begins with a speech encoder 410 receiving audio data from the microphone 405 and the speech encoder 410 converts the received audio data into digital data. The channel encoder 415 receives the digital data stream from the speech encoder and the channel encoder adds error correction information to digital data. Frequency synthesizers 435 are used to generate the various RF frequencies used by handset 400. The upconverting modulator 420 receives transformed data from the channel encoder 415 and RF frequency signal from the frequency synthesizers 435, wherein the transformed data is digitally modulated. A Doherty-type power amplifier subsystem 425 receives modulated data from the digital modulator, where the Doherty-type amplifier subsystem 425 amplifies the modulated digital signal from the upconverting modulator 420. The amplified digital signal is transmitted to the cell phone antenna 465.

The receiving process starts with the receiver 460 receiving a digital signal from the antenna 465 and transmits the received signal to the mixer 430. The mixer 430 converts the modulated received signal to a base band signal. The digital demodulator 440 receives base band signal from the mixer 430 and converts the base band signal into digital modulated signal. A channel decoder 445 performs error correction and recovers the digital signal. The speech decoder 450 receives decoded digital data stream and the speech decoder 450 converts received digital data to audio sound. The audio sound is output by the speaker 455.

While certain exemplary embodiments have been described and shown in the accompanying drawings, it is to be understood that such embodiments are merely illustrative and not restrictive of the broad invention and that this invention is not limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principals of the present disclosure or the scope of the accompanying claims.

The invention claimed is:

1. A method for high-efficiency radio frequency (RF) power amplification, comprising the steps of:
receiving, from one or more inputs of a subsystem, control and power signals comprising RF power input signal to the subsystem, power control signal representing real time required output power of the subsystem, and output power range signal specifying a required output power range of the subsystem among a plurality of pre-determined required output power ranges, wherein the subsystem transmits data during consecutive transmission time slots separated by guard time during which no data is transmitted;
sampling power output at an amplifier output of a main stage amplifier in the subsystem to generate signal representing the output power;
comparing, using a comparator, the signal representing the output power with the power control signal to generate first biasing information;
receiving the output power range signal during guard time prior to an upcoming transmission time slot of the consecutive transmission time slots, wherein the specified required output power range corresponds to a requirement of the power output for the upcoming transmission time slot;
generating, using a power level interface circuit, second biasing information based on the specified required output power range;
reconfiguring, using a bias network control circuit based on the first and second biasing information and during guard time prior to the upcoming transmission time slot, bias of an amplifier block to meet a pre-determined output power time template, wherein the amplifier block comprises the main stage amplifier;
coupling the amplifier output to a load mismatch protection circuit, wherein the load mismatch protection circuit monitors real time load variation at a subsystem output for making adjustment to provide a well-controlled impedance within a specified range to the amplifier output; and
amplifying the RF power input signal using the amplifier block.

2. The method of claim 1, wherein receiving the control and power signals comprises the steps of:
receiving the power control signal from a first input, of the one or more inputs, operatively coupled to the comparator;
receiving the RF power input signal from a second input of the one or more inputs;
receiving direct current (DC) power signal for the subsystem from a third input of the one or more inputs;
receiving band selection signal from a fourth input of the one or more inputs, wherein the band selection signal determines a frequency band of the subsystem;
receiving mode control signal from a fifth input, of the one or more inputs, operatively coupled to the bias network control circuit to adjust bias of the amplifier block according to application requirements for a specific wireless protocol; and
receiving the output power range signal from a sixth input, of the one or more inputs, operatively coupled to the power level interface circuit that transmits the second biasing information to the bias network control circuit.

3. The method of claim 2, further comprising the steps of:
generating third biasing information based on the mode control signal;
receiving, by the bias network control circuit, the first, second, and third biasing information from the comparator, the power level interface circuit, and the mode control signal; and
adapting the amplifier block based on bias thereof to adjust for changes in required subsystem output power.

4. The method of claim 3, further comprising the step of:
representing an entire output range of the subsystem by 2N power ranges, wherein N is a number of inputs to the power level interface circuit.

5. The method of claim 3, further comprising the step of:
mapping specific values of the output range signal to specific power states of the subsystem.

6. The method of claim 3, wherein adapting the amplifier block comprises the step of:
reconfiguring bias of the amplifier block to discrete bias settings corresponding to specific power ranges.

7. The method of claim 3, wherein adapting the amplifier block comprises the step of:
adaptively adjusting bias settings for each of the pre-determined required output power ranges.

8. The method of claim 1, wherein sampling the power output comprises the steps of:
sampling the power output during the transmission time periods; and
transmitting the signal representing the output power to the comparator to reconfigure bias of the amplifier block during guard time between the transmission time periods.

9. An electronic apparatus for high-efficiency radio frequency (RF) power amplification, comprising:
one or more inputs configured to receive control and power signals of a subsystem comprising RF power input signal to the subsystem, power control signal representing real time required output power of the subsystem, and output power range signal specifying a required output power range of the subsystem among a plurality of pre-determined required output power ranges, wherein the subsystem is configured to transmit data during consecutive transmission time slots separated by guard time during which no data is transmitted;
an output power sampling circuit configured to sample amplifier output power at an amplifier output of a amplifier block in the subsystem and transmit signal representing the amplifier output power to a comparator;
the comparator configured to compare the signal representing the amplifier output power with the power control signal to generate first biasing information representing power difference between the amplifier output power and the required output power;
a power level interface circuit configured to generate second biasing information based on the specified required output power range during guard time prior to an upcoming transmission time slot of the consecutive transmission time slots, wherein the specified required output power range corresponds to a requirement of the power output for the upcoming transmission time slot;
a bias network control circuit configured to adapt, based on the first and second biasing information and during guard time prior to the upcoming transmission time slot, bias condition of the amplifier block to meet a pre-determined output power time template;
a load mismatch protection circuit configured to monitor real time load variation at a subsystem output for making adjustment to provide well-controlled load within a specified range to the amplifier output; and
the amplifier block configured to amplify the RF power input signal to generate the amplifier output power that is transmitted to the subsystem output via the load mismatch protection circuit.

10. The electronic apparatus of claim 9, further comprising:

a first input of the one or more inputs configured to receive the power control signal;
a second input of the one or more inputs configured to receive RF power input signal;
a third input of the one or more inputs configured to receive DC power to the subsystem;
a fourth input of the one or more inputs configured to receive a band selection signal, wherein the band selection signal determines the subsystem frequency band;
a fifth input of the one or more inputs configured to receive mode control signal operatively coupled to the bias network control circuit to adjust bias condition of the amplifier block according to operational requirements for a specific wireless protocol; and
a sixth input of the one or more inputs configured to receive the output power range signal.

11. The electronic apparatus of claim 9, the power level interface circuit further configured to determine, during guard time between the consecutive transmission time periods, an optimum power range for meeting the required output power; and transmit the second biasing information, corresponding to the optimum power range, to the bias network control network.

12. The electronic apparatus of claim 9,
wherein an entire output range of the subsystem comprises 2N distinct power ranges,
wherein N is a number of inputs to the power level interface circuit.

13. The electronic apparatus of claim 9, wherein the power level interface circuit maps specific values of the output range signal to specific power states of the subsystem.

14. The electronic apparatus of claim 9, wherein the bias network circuit uses specific bias settings, corresponding to specific power ranges, to reconfigure bias condition of the amplifier block.

15. The electronic apparatus of claim 9, wherein the network bias control circuit adaptively adjusts bias condition of the amplifier block for each of the pre-determined required output power ranges.

16. The electronic apparatus of claim 9, wherein the load mismatch protection circuit is further configured to monitor the impedance variation to provide the well-controlled load for the amplifier output.

17. An electronic apparatus for multi-model/multi-band high-efficiency power amplification, comprising:
first and second amplifier mode modules configured to receive RF power input signal to a subsystem from a first input, required output power range signal from a second input for specifying an output power range of the subsystem among a plurality of pre-determined required output power ranges, and power control signal from a third input for representing required output power of the subsystem, wherein the first and second amplifier mode modules are configured to transmit data during consecutive transmission time slots separated by guard time during which no data is transmitted;
an output power sampling circuit configured to sample mode module output power from an amplifier output of the first and second amplifier mode modules and transmit signal representing the mode module output power to a comparator;
the comparator configured to compare the signal representing the mode module output power with the power control signal to generate first biasing information representing power difference between the mode module output power and the required output power;

a power level interface circuit configured to generate second biasing information based on the specified output power range during guard time prior to an upcoming transmission time slot of the consecutive transmission time slots, wherein the specified output power range corresponds to a requirement of the power output for the upcoming transmission time slot;

a bias network control circuit configured to adjust, based on the first and second biasing information and during guard time prior to the upcoming transmission time slot, bias condition of an amplifier block in the first and second amplifier mode modules to meet a pre-determined output power time template; and a load mismatch protection circuit configured to monitor real time load variation at a subsystem output for making adjustment to provide well-controlled load within a specified range to the amplifier output, wherein the first and second amplifier mode modules are further configured to amplify the RF power input signal to generate the mode module output power that is transmitted to subsystem output via the load mismatch protection circuit.

18. The electronic apparatus of claim 17, further comprising:

a fourth input configured to receive DC power to the subsystem;

a fifth input configured to receive mode control signal operatively coupled to the bias network control circuit to adjust bias condition of the amplifier block according to operational requirements for a specific wireless protocol; and a sixth input configured to receive a band selection signal, wherein the band selection signal determines a frequency band of the amplifier block.

19. The electronic apparatus of claim 17, wherein the power level interface circuit is further configured to determine, during guard time between the consecutive transmission time periods, an optimum power range for meeting the required output power; and transmit the second biasing information, corresponding to the optimum power range, to the bias network control network.

20. The electronic apparatus of claim 17, wherein an entire output range of the subsystem comprises 2N distinct power ranges, wherein N is a number of inputs to the power level interface circuit.

21. The electronic apparatus of claim 17, wherein the power level interface circuit maps specific values of the output range signal to specific power states of the subsystem.

22. The electronic apparatus of claim 17, wherein the bias network circuit uses specific bias settings, corresponding to specific power ranges, to reconfigure bias condition of the amplifier block.

23. The electronic apparatus of claim 17, wherein the network bias control circuit adaptively adjusts bias condition of the amplifier block for each of the pre-determined output power ranges.

24. The electronic apparatus of claim 17, wherein the amplifier block comprises at least one selected from a group consisting of:

a first amplifier block, within the first amplifier mode module, operating in a first wireless protocol selectively specified by the mode control signal and operating at a first frequency band selectively specified by the band selection signal; and a second amplifier block, within the second amplifier mode module, operating in a second wireless protocol selectively specified by the mode control signal and operating at a second frequency band selectively specified by the band selection signal.

25. An electronic apparatus for a cell phone handset using a Doherty-type power amplifier subsystem, comprising:

a speech encoder configured to receive audio data from a microphone and transform the audio data into digital data;

a channel encoder configured to receive the digital data from the speech encoder and add error correction information to the digital data to generate transformed data;

one or more frequency synthesizers configured to generate a RF frequency signal used by the cell phone handset;

an upconverting modulator configured to receive the transformed data from the channel encoder and the RF frequency signal from the frequency synthesizers, wherein the upconverting modulator is further configured to digitally modulate the transformed data to generate modulated signal;

a Doherty-type amplifier subsystem configured to receive the modulated signal from the upconverting modulator and amplify the modulated signal for transmitting to an antenna of the cell phone handset;

a receiver configured to receive input signal from the antenna and transmit the input signal to a mixer;

the mixer configured to convert the input signal to a base band signal;

a digital demodulator configured to receive the base band signal from the mixer, and convert the base band signal to digital modulated signal;

a channel decoder configured to remove error correction information from the digital modulated signal to generate decoded digital data stream; and a speech decoder configured to receive the decoded digital data stream and convert the decoded digital data stream to audio sound, wherein the Doherty-type amplifier subsystem is further configured to:

transmit the modulated signal during consecutive transmission time slots separated by guard time during which no signal is transmitted; and receive, during guard time prior to an upcoming transmission time slot of the consecutive transmission time slots, required output power range signal for specifying an output power range of the Doherty-type amplifier subsystem among a plurality of pre-determined required output power ranges, and wherein the Doherty-type amplifier subsystem comprises:

a power level interface circuit configured to generate biasing information based on the specified output power range during guard time prior to the upcoming transmission time slot, wherein the specified output power range corresponds to a requirement of power output of the Doherty-type amplifier subsystem for the upcoming transmission time slot; and a bias network control circuit configured to adjust, based on the biasing information and during guard time prior to the upcoming transmission time slot, bias condition of an amplifier block in Doherty-type amplifier subsystem to meet a pre-determined output power time template.

* * * * *